US007721000B2

(12) United States Patent
Kim

(10) Patent No.: US 7,721,000 B2
(45) Date of Patent: May 18, 2010

(54) METHOD OF COMPRESSING AND DECOMPRESSING EXECUTABLE FILE IN MOBILE COMMUNICATION TERMINAL

(75) Inventor: Ho Yeon Kim, Seoul (KR)

(73) Assignee: Pantech & Curitel Communications, Inc., Seoul (KR)

(*) Notice: Subject to any disclaimer, the term of this patent is extended or adjusted under 35 U.S.C. 154(b) by 826 days.

(21) Appl. No.: 11/489,661

(22) Filed: Jul. 17, 2006

(65) Prior Publication Data
US 2007/0015527 A1 Jan. 18, 2007

(30) Foreign Application Priority Data
Jul. 18, 2005 (KR) ............ 10-2005-0064857

(51) Int. Cl.
*H04B 7/00* (2006.01)
*G06F 12/00* (2006.01)

(52) U.S. Cl. .............. 709/247; 709/212; 709/215; 711/174; 711/103; 717/168; 717/174; 717/176; 717/175; 717/178

(58) Field of Classification Search ........ 709/212, 709/215, 247; 711/174, 103; 717/168, 174–176, 717/178
See application file for complete search history.

(56) References Cited

U.S. PATENT DOCUMENTS

| | | | | |
|---|---|---|---|---|
| 5,675,731 A | * | 10/1997 | Fuller | 714/38 |
| 5,878,267 A | * | 3/1999 | Hampapuram et al. | 712/24 |
| 6,243,330 B1 | * | 6/2001 | Oshima | 380/228 |
| 6,421,776 B1 | * | 7/2002 | Hillis et al. | 713/2 |
| 6,718,548 B1 | * | 4/2004 | Hsiao | 717/174 |
| 2002/0129233 A1 | * | 9/2002 | Hillis et al. | 713/2 |
| 2002/0152219 A1 | * | 10/2002 | Singh | 707/101 |
| 2004/0163112 A1 | * | 8/2004 | Matula et al. | 725/50 |
| 2005/0021572 A1 | * | 1/2005 | Ren et al. | 707/203 |
| 2005/0100313 A1 | * | 5/2005 | Wang | 386/46 |
| 2005/0114852 A1 | * | 5/2005 | Chen et al. | 717/168 |
| 2005/0204351 A1 | * | 9/2005 | Jiang et al. | 717/162 |
| 2005/0216537 A1 | * | 9/2005 | Jiang et al. | 707/205 |
| 2007/0050762 A1 | * | 3/2007 | Chen et al. | 717/169 |
| 2007/0079306 A1 | * | 4/2007 | Qumei | 717/168 |
| 2007/0089108 A1 | * | 4/2007 | Chen et al. | 717/168 |
| 2007/0234015 A1 | * | 10/2007 | Chen et al. | 712/225 |
| 2008/0184220 A1 | * | 7/2008 | Chen et al. | 717/171 |

FOREIGN PATENT DOCUMENTS

| KR | 1020040087716 | 10/2004 |
|---|---|---|
| KR | 1020050069564 | 7/2005 |

OTHER PUBLICATIONS

Kjar, Michael, Setup and Use of the ARM Interrupt Controller (AITC), Freescale Semiconductor Application Note, Document No. AN2411, Rev. 2, Jul. 2005.*

* cited by examiner

*Primary Examiner*—Alina N. Boutah
(74) *Attorney, Agent, or Firm*—H.C. Park & Associates, PLC

(57) ABSTRACT

Disclosed is a method of compressing and decompressing an executable file in a mobile communication terminal capable of improving a compression mode of an executable file necessary for an operation of the mobile communication terminal to reduce a booting time of the terminal and to smoothly carrying out a wireless upgrade service. The method of the invention divides storage spaces in which executable files are stored into plural areas depending on properties of the executable files using a scatter loading file and selectively compressing each of the areas.

5 Claims, 2 Drawing Sheets ly expanded, many people possess the mobile communication terminal. In addition, in order to meet the needs for a variety of function improvements of users, various functions such as reproduction of a music file, wireless internet and the like have been added to the mobile communication terminal, in addition to the basic telecommunication function.
METHOD OF COMPRESSING AND DECOMPRESSING EXECUTABLE FILE IN MOBILE COMMUNICATION TERMINAL

CROSS-REFERENCE TO RELATED APPLICATION

The present application is claiming priority of Korean Patent Application No. 10-2005-0064857, filed on Jul. 18, 2005, the content of which is herein incorporated by reference.

BACKGROUND OF THE INVENTION

1. Field of the Invention

The present invention relates to a method of compressing and decompressing an executable file in a mobile communication terminal, and more particularly to a method of compressing and decompressing an executable file in a mobile communication terminal capable of improving a compression manner of an executable file necessary for an operation of the mobile communication terminal, thereby reducing a booting time of the terminal and smoothly carrying out a wireless upgrade service.

2. Description of the Prior Art

A boot-up process of a mobile communication terminal having mounted a predetermined operating system therein is a process progressed from after power is applied thereto until an initial screen is displayed. The boot-up process can be specifically divided into (1) an initialization process of a central control unit, (2) an initialization process of a RAM, (3) an initialization process of a hardware and (4) an initialization process of a task.

(1) The initialization process of the central control unit is a process of initializing a central control unit of the mobile communication terminal such as micro processor unit (MPU) or micro controller unit (MCU). (2) The initialization process of the RAM is a process of filling a zero-initialization area of the RAM with number 0 and then copying a code stored in an electrically erasable programmable read only memory (EEPROM) into a code area of the RAM. (3) The initialization process of the hardware is a process of initializing all hardware in the mobile communication terminal. (4) The initialization process of the task is a process of initializing an operating system (OS) of a mobile station module (MSM).

Among the initialization processes constituting the boot-up process, the initialization process of the RAM and the initialization process of the task take the most time to progress the boot-up process.

In the mean time, as the communication industry has been developed and the mobile communication service has been rapidly expanded, many people possess the mobile communication terminal. In addition, in order to meet the needs for a variety of function improvements of users, various functions such as reproduction of a music file, wireless internet and the like have been added to the mobile communication terminal, in addition to the basic telecommunication function.

As the various additional functions have been added to the mobile communication terminal, it is increased the time required for the boot-up process since every additional functions should be also initialized when the terminal is booted. Specifically, when the boot-up process of the terminal is progressed, an operating system of the additional function such as WIPI module of the wireless internet, camera module of a digital camera and the like should be copied to the code area of the memory. In addition, when the operating system of the additional function is copied to the code area, a task of the additional function should be initialized. Accordingly, any function is added to the mobile communication terminal, it is also increased the booting time required for the boot-up process due to the increase of the copying time to the code area of the memory and the increase of the time to initialize the task of the additional functions.

In order to solve the problem in that the booting time is increased due to the additional functions, the conventional technology adopts a method of compressing an executable file. In other words, according to the prior art, the RAM initialization and the task initialization are progressed by storing the compressed executable file in the EEPROM of the mobile communication terminal and copying the compressed executable file to the RAM.

However, the method of compressing the executable file according to the prior art adopts a manner of compressing the executable files (for example, gzip, bzip, etc.) entirely, so that it takes much time to decompress the entirely compressed executable file. As a result, the method cannot substantially reduce the booting time.

In addition, in recent years, as various functions are added, it is frequently required the firmware upgrade. When carrying out the wireless upgrade manner such as FOTA (Firmware Over The Air), if it is used the method of compressing entirely the executable files, it is prolonged the time necessary for the upgrade.

SUMMARY OF THE INVENTION

Accordingly, the present invention has been made to solve the above problems. An object of the invention is to provide a method of compressing an executable file in a mobile communication terminal capable of improving a compression mode of an executable file necessary for an operation of the mobile communication terminal, thereby reducing a booting time of the terminal and smoothly carrying out a wireless upgrade service.

In order to achieve the above object, there is provided a method of compressing an executable file in a mobile communication terminal, the method comprising: dividing storage spaces in which executable files are stored into plural areas depending on properties of the executable files using a scatter loading file and selectively compressing each of the areas.

Preferably, only an area of the plural areas, in which data files are loaded, may be compressed.

Preferably, an area of the plural areas, in which code files are loaded, may not be compressed.

Preferably, the areas including the area in which the data files are loaded may be selectively compressed.

Preferably, each of the areas constituting the storage spaces may be discriminated to have a priority ranking when being executed.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
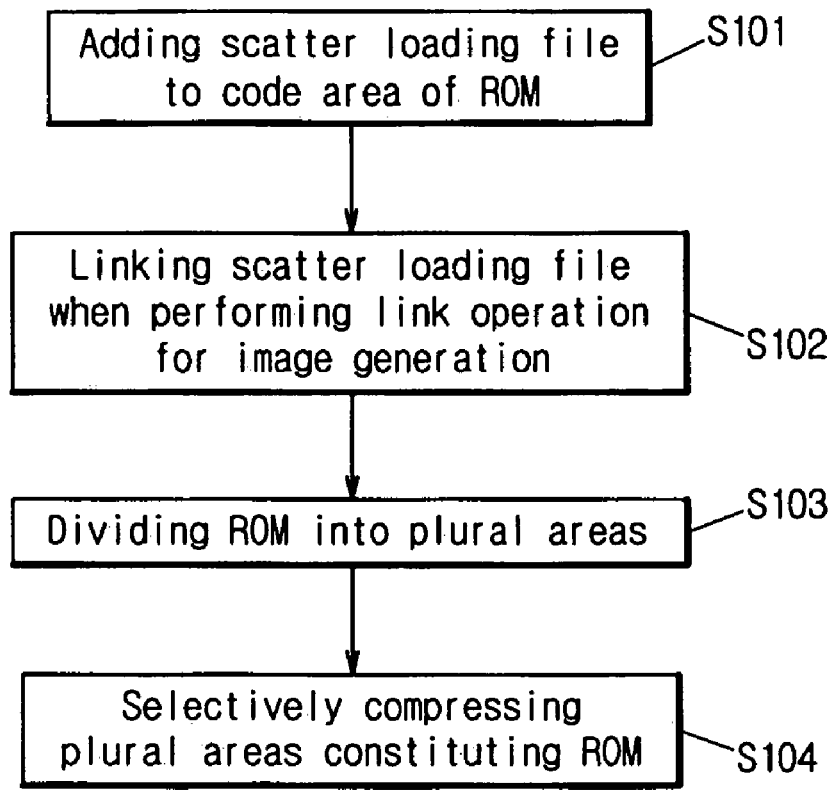
FIG. 1 is a flow chart for illustrating a method of compressing an executable file in a mobile communication terminal according to an embodiment of the invention.

Hereinafter, a preferred embodiment of the present invention will be described with reference to the accompanying drawings. In the following description of the present invention, a detailed description of known functions and configurations incorporated herein will be omitted when it may make the subject matter of the present invention rather unclear.

According to the invention, when executable files that drive a mobile communication terminal may be divided into plural areas using the scatter loading file and the divided plural areas are selectively compressed. Accordingly, it is possible to effectively operate an embedded file system of the mobile communication terminal, to reduce the booting time when carrying out the boot-up process of the mobile communication terminal and to easily progress a wireless transmitting/receiving process such as FOTA.

According to the invention, the executable files stored in a read only memory (ROM) of the mobile communication terminal are selectively compressed. In this case, it is selectively performed whether or not to compress the files, depending on, for example, whether the executable files are code files or data files.

Before explaining the selective compression method of the invention, it is described the executable files stored in a ROM of a typical mobile communication terminal.

The executable files stored in the ROM of the typical mobile communication terminal can be classified into a code file and a data file, depending on the properties thereof. The code file is meant by a program command and may be represented by an extension such as inti.o, lcd.o, usb.o, wab.o and the like. The data file is meant by data which is used for a program.

In the mean time, all images displayed in a display screen of the mobile communication terminal are generated thorough predetermined compile and link processes. Specifically, object files are generated by using a compiler and an image file is generated by linking with the object files. The image files of the ROM generated through these processes are copied to a random access memory (RAM) when the mobile communication terminal is booted. However, as described above, as various functions are added a mobile communication terminal, a size of the image file is enlarged, so that the copying time from the ROM to the RAM is increased.

For example, when the boot-up process of the mobile communication terminal is executed under state that an image file of 32 M bytes is stored in the ROM through the compile and link processes, the image file of 32 M bytes stored in the ROM should be copied to the RAM for the booting. At this time, it would take about 10 seconds to copy the image file of 32 M bytes from the ROM to the RAM. Thereby, a user of the mobile communication terminal should wait about 10 seconds or more from after the user turns on the terminal until an initial screen is displayed. This is because the image file of 32 M bytes is copied to the RAM in a lump and executed without a priority ranking.

In order to solve the problem, the invention uses a scatter loading manner. The scatter loading manner is a technique of dividing one program file into plural pieces and scatter-loading them in a main memory space. The scatter loading manner is more specifically described with reference to FIG. 1. FIG. 1 is a flow chart for illustrating a method for compressing an executable file in a mobile communication terminal according to an embodiment of the invention.

As shown in FIG. 1, a scatter loading file is added to a code area of a ROM of a mobile communication terminal (S101) and then linked to an object file stored in the ROM when performing a link operation for an image generation (S102). As a result, the object file linked to the scatter loading file is preferentially executed. For example, the scatter loading file is generated and added so that a file, which is required to be preferentially executed among the executable files such as init.o, lcd.o, wab.o and the like in booting, is executed. An example of the scatter loading file is shown in a table 1.

TABLE 1

```
LOAD_ROM   0 x 0000    0 x 8000000
{
    EXEC_ROM   0 x 0000   0 x 8000
    {
        init.o    (+ RO)
        lcd.o     (+ RO)
        usb.0     (+ RO)
    }
    RAM   0 x 10000    0 x 6000
    {
            *(+ RW, + ZI)
    }
}
```

Analyzing the scatter loading file shown in the table 1, it is meant that when an image is generated, init.o, lcd.o and usb.o files are arranged to 0 address ~0×8000 address in a read only (RO) attribute and all the other files are initialized and arranged between 0×10000 address and 0×6000 to be readable/writable attribute.

According to the scatter loading file described in the table 1, the executable files stored in the ROM of the mobile communication terminal are scatter-loaded in two areas. In other words, as shown in a table 2, the areas are divided into a first area in which init.o., lcd.o and usb.o files are loaded and a second area in which the other object files are loaded.

TABLE 2

| detail areas of ROM | files to be loaded |
| --- | --- |
| first area | init.o |
|  | lcd.o |
|  | usb.o |
| second area | the other object files |

The ROM is divided into the first and second areas by the scatter loading file, and when the executable files loaded in the first and second areas are copied to the RAM during the boot-up process, the executable files loaded in the first area, i.e., init.o, lcd.o and usb.o are preferentially copied and executed. As a result, it is possible to copy and execute the particular files without copying all the object files stored in the ROM, so that the boot-up process can be smoothly progressed.

For example, when the total size of the files stored in the ROM is 32 M bytes and the size of the files, e.g., init.o, lcd.o and usb.o, which are necessary for a screen-initialization of the mobile communication terminal, is 1M bytes, the necessary files may be stored in the first area and the other object files may be stored in the second area of the ROM.

And then, the files stored in the first area are preferentially copied to the RAM and executed than the files stored in the second area when the mobile communication terminal is in boot-up process. The files stored in the second area are copied to the RAM during initialized screen of the mobile communication terminal is displayed by executing the necessary files. By preferential copying and executing for the files stored in the first area as described above, it takes less time to display the initialized screen of the mobile communication terminal from its turned on.

In the tables 1 and 2, the ROM is divided into the two areas, i.e., first and second areas. However, the division of the ROM is not limited with regard to the number of areas. In other words, a user can divide the ROM into three or more areas.

The scatter loading manner using the scatter loading file has been described. In the mean time, according to the invention, the executable files stored in the ROM are selectively compressed. The selective compression of the executable files uses the information described in the scatter loading file.

As described regarding the tables 1 and 2, it is possible to divide and define the ROM area into plural areas using the scatter loading file (S103). In the invention, the selective compression of the executable files is meant by selectively compressing the plural areas of the ROM (S104). For example, when the ROM is divided into first, second and third areas, it can be set that the executable files in the first and second areas are compressed and the executable files in the third area is not compressed.

The selective compression for the plural areas of the ROM can be carried out on the basis of various standards. However, since the object of the invention is to implement the rapid copying of the executable files so as to increase the booting speed and to smoothly perform the FOTA, it is preferred to determine whether the executable files are compressed or not, depending on whether the corresponding area of the ROM is the code area or data area.

Typically, the code files loaded in the code area of the ROM have a complex hexa structure, so that the substantial time is required for the compression and decompression. To the contrary, the data files loaded in the data area have a simple structure, so that less time is required for the compression and decompression.

Using such properties, among the plural areas constituting the ROM, the areas corresponding to the code area are not compressed and only the areas corresponding to the data area are selectively compressed (S104).

According to the invention, when the executable files are selectively compressed depending on the properties of the areas in which they are loaded, it is possible to effectively reduce the time for the compression and decompression, as compared to the conventional method of compressing or decompressing all the executable files of the ROM at a time. In addition, since the compression is selectively carried out, it is possible to effectively operate the embedded file system of the mobile communication terminal.

Hereinafter, it is described an application example of the method of compressing an executable file in the mobile communication terminal. First, an example to be applied to the boot-up process is described.

Figure 2:
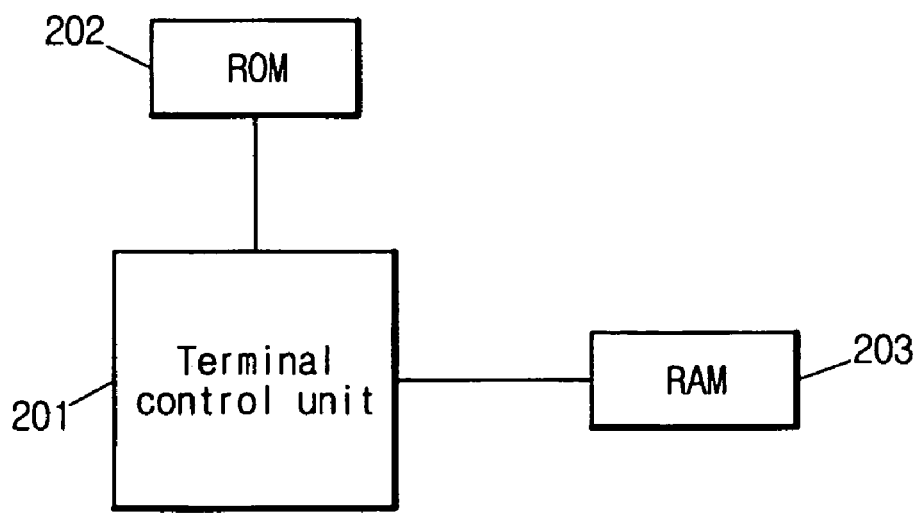
FIG. 2 is a block diagram of a mobile communication terminal.

As shown in FIG. 2, the mobile communication terminal is provided with a terminal control unit 201 for controlling a general operation of the terminal and a ROM 202 and a RAM 203, which are storage means. The ROM 202 stores operating programs of the terminal and the RAM 203 stores a program necessary for the operation of the terminal and various data which are produced resulting from the operation. In addition, the RAM 203 functions to store the operating programs which are copied from the ROM 202 as a boot loader is executed during the booting.

Figure 3:
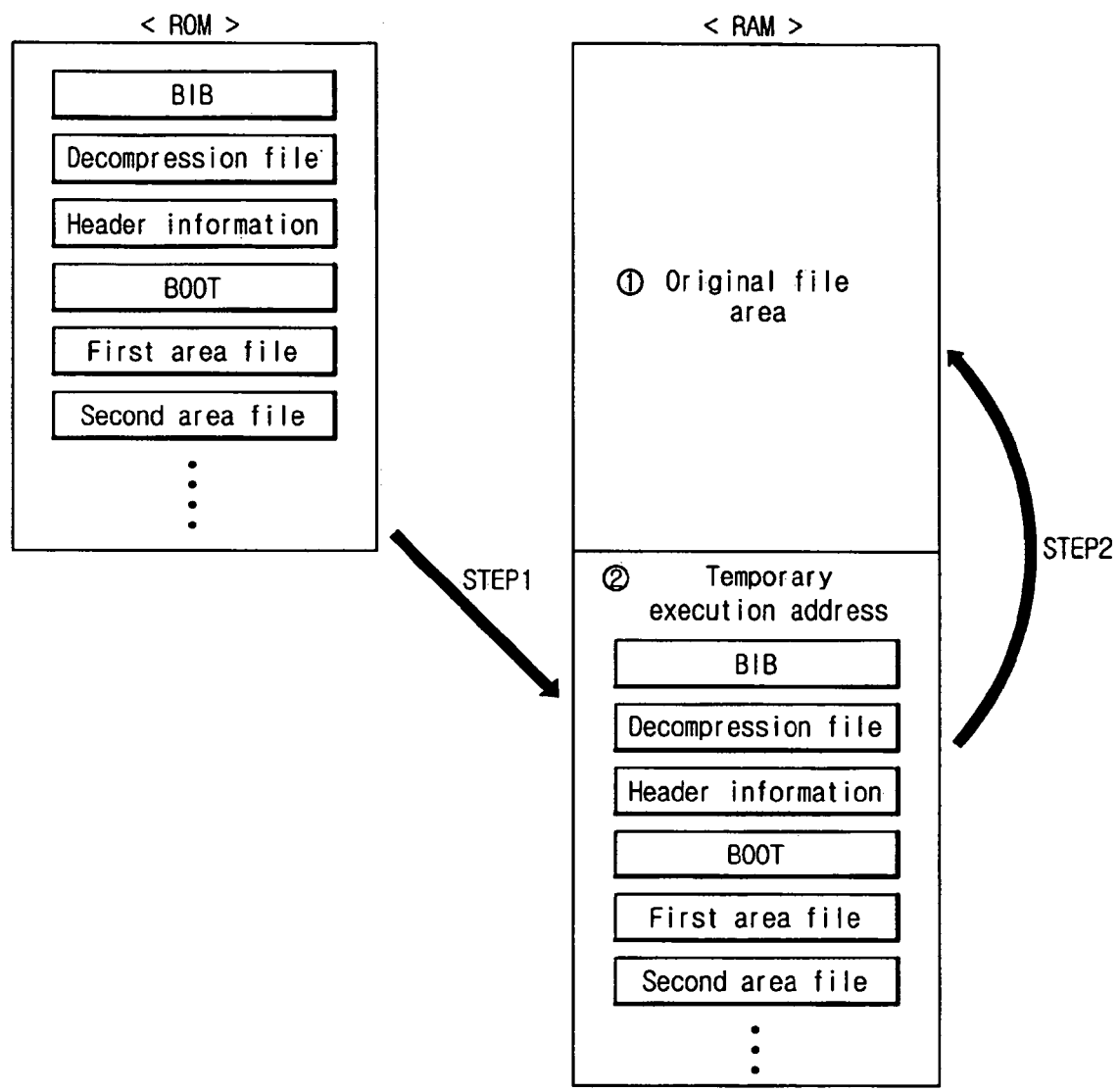
FIG. 3 is a view for illustrating a boot-up process of a mobile communication terminal according to an embodiment of the invention.

In the mean time, the detail areas constituting the ROM 202 are more specifically described as follows. First, as shown in FIG. 3, the ROM is provided with a boot information block (BIB) in which the information, which is required to load the executable files in the ROM to the RAM, is stored. In addition, the ROM is loaded with files of plural areas such as first area file and second area file, which are copied to the RAM. Herein, the files of plural areas are selectively compressed. For example, the first area file may be compressed and the second area file may not be compressed. In addition, the first area files may be meant by files loaded in the data area and the second area files may be meant by files loaded in the code area. In addition to the constitution elements, the ROM may be mounted with a decompression file, header information, a boot file and the like in a form of an image file.

The boot-up process of the mobile communication terminal having the above structure is described as follows. When the mobile communication terminal is turned on, the boot loader is executed, so that the boot loader copies the decompression file, the header information and the first and second area files loaded in the ROM to a temporary execution address of the RAM capable of executing the decompression process with reference to the BIB and moves a program counter (PC) to the temporary execution address (step 1).

Then, based on the header information, the boot loader performs the processes of copying, compressing or decompressing the first and second area files, which have been copied to the temporary execution address, to the original file area of the RAM, and moves the program counter to the 0×000000000 address of the original file area of the RAM, thereby progressing the boot-up process (step 2). At this time, since the first area is under compressed state and the second area is under not-compressed state, the first area files should be decompressed before it is copied to the original file area of the RAM.

During the boot-up process of the mobile communication terminal, since only the first area files, for example, among the first and second area files are selectively compressed and is selectively subject to the decompression process when performing the copying process to the RAM, it is possible to effectively reduce the time for the compression and decompression.

In the mean time, the method of compressing executable files in the mobile communication terminal according to the invention can be variously modified, besides the above described embodiment of selectively compressing the file areas of the ROM. A modified example thereof is an application to FOTA.

The FOTA is a technology for receiving the software such as new firmware via the wireless network. The transmitting/receiving process should be smoothly carried out between the mobile communication terminal, which is a file destination, and a server, which is a file provider, so as to smoothly progress the FOTA process. In order to smoothly progress the file transmitting/receiving process between the mobile communication terminal and the server, the size of the file to be transmitted/received should be effectively structured. When the method of compressing the executable file according to the invention is applied to this transmitting/receiving process, the size of the files is significantly reduced, and the upgrade process such as FOTA is easily progressed as the compression and decompression processes are selectively carried out.

More specifically, in case of transmitting a new firmware stored in a predetermined internet server, when the files of the boot area to a mobile communication terminal, the code area and the like constituting the firmware are generated into binary image files using the scatter loading file and the boot area or code area is selectively compressed and then transmitted to a mobile communication terminal, the terminal selectively decompresses the transmitted firmware like the aforementioned boot-up process of the mobile communication terminal and stores it in the ROM. As a result, it is possible to reduce the time required for the FOTA process.

As described above, according to the invention, when constituting the executable files driving the mobile communication terminal, the executable files are divided into the plural areas using the scatter loading file and the divided plural areas are selectively compressed. Therefore, it is possible to effectively operate the embedded file system of the mobile communication terminal, to reduce the booting time during the boot-up process of the mobile communication terminal and to easily progress the wireless transmitting/receiving process such as FOTA.

While the invention has been shown and described with reference to certain preferred embodiments thereof, it will be understood by those skilled in the art that various changes in form and details may be made thereto without departing from the spirit and scope of the invention as defined by the appended claims.

What is claimed is:

1. A method of compressing an executable file in a mobile communication terminal, the method comprising:
   dividing storage spaces in which executable files are stored into plural areas depending on properties of the executable files using a scatter loading file, the executable files comprising code files and data files; and
   selectively compressing the areas according to whether the executable file stored in each area is a code file or a data file.

2. The method according to claim 1, wherein only areas in which data files are loaded are compressed.

3. The method according to claim 1, wherein areas in which code files are loaded are not compressed.

4. The method according to claim 1, wherein the areas including the area in which the data files are loaded are selectively compressed.

5. The method according to claim 1, wherein each of the areas constituting the storage spaces is discriminated to have a priority ranking when being executed.

* * * * *